United States Patent
Suh et al.

(10) Patent No.: US 9,450,033 B2
(45) Date of Patent: Sep. 20, 2016

(54) ORGANIC LIGHT EMITTING DIODE (OLED) DISPLAY APPARATUS HAVING LIGHT SENSING FUNCTION

(75) Inventors: Sung Joo Suh, Seoul (KR); Chang Kyu Choi, Seongnam-si (KR); Kwon Ju Yi, Yongin-si (KR); Du Sik Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 182 days.

(21) Appl. No.: 13/296,795

(22) Filed: Nov. 15, 2011

(65) Prior Publication Data
US 2012/0176298 A1    Jul. 12, 2012

(30) Foreign Application Priority Data
Jan. 10, 2011    (KR) .................. 10-2011-0002291

(51) Int. Cl.
H01L 27/32    (2006.01)
H04N 7/14    (2006.01)
G09G 3/32    (2016.01)

(52) U.S. Cl.
CPC ......... *H01L 27/3234* (2013.01); *G09G 3/3208* (2013.01); *H04N 7/144* (2013.01); *G09G 2300/046* (2013.01)

(58) Field of Classification Search
CPC ... H04N 7/144; G06F 3/0412; G06F 3/0425; H01L 27/14678; H01L 27/3234
USPC ........................................ 345/156, 173–178
See application file for complete search history.

(56) References Cited

U.S. PATENT DOCUMENTS

| | | | |
|---|---|---|---|
| 6,454,414 B1 | 9/2002 | Ting | |
| 2004/0263670 A1 | 12/2004 | Yamasaki | |
| 2006/0157640 A1 | 7/2006 | Perlman et al. | |
| 2008/0106628 A1* | 5/2008 | Cok et al. | 348/333.01 |
| 2008/0143650 A1* | 6/2008 | Tomida et al. | 345/76 |
| 2010/0238263 A1 | 9/2010 | Robinson et al. | |
| 2010/0283765 A1* | 11/2010 | Gotoh et al. | 345/175 |
| 2012/0086647 A1* | 4/2012 | Birkler | 345/173 |

FOREIGN PATENT DOCUMENTS

| | | |
|---|---|---|
| CN | 101228460 A | 7/2008 |
| CN | 101533170 A | 9/2009 |
| CN | 101609647 A | 12/2009 |
| JP | 2004-326786 | 11/2004 |
| JP | 2010-250789 A | 11/2010 |
| KR | 10-2009-0065182 | 6/2009 |
| KR | 10-2009-0087351 | 8/2009 |
| KR | 10-2009-0116160 | 11/2009 |

OTHER PUBLICATIONS

Matthew Hirsch, et al. "Bidi Screen: A Thin, Depth-Sensing LCD for 3D Interaction using Light Fields" in propceeding of SIGGRAPH ASIA, Dec. 2009, 9pages.
European Search Report dated May 2, 2012 and issued in corresponding European Patent Application 12150282.7.
Chinese Office Action issued Dec. 1, 2014, in counterpart Chinese Application No. 201110461350.4 (16 pages in English, 11 pages in Chinese).
Japanese Office Action issued on Aug. 25, 2015, in couterpart Japanese Application No. 2012-001082 (4 pages in English, 4 pages in Japanese).

* cited by examiner

*Primary Examiner* — David Tung
(74) *Attorney, Agent, or Firm* — NSIP Law

(57) ABSTRACT

An organic light emitting diode (OLED) display apparatus having an optical sensing function is provided. The OLED display apparatus may photograph an external object by sensing input light from the external object that passes through an imaging pattern included in a display panel.

13 Claims, 7 Drawing Sheets

ORGANIC LIGHT EMITTING DIODE (OLED) DISPLAY APPARATUS HAVING LIGHT SENSING FUNCTION

CROSS-REFERENCE TO RELATED APPLICATIONS

This application claims the priority benefit of Korean Patent Application No. 10-2011-0002291, filed on Jan. 10, 2011, in the Korean Intellectual Property Office, the disclosure of which is incorporated herein by reference.

BACKGROUND

1. Field

One or more example embodiments of the present disclosure relate to an organic light emitting diode (OLED) display apparatus that enables a sensor panel to sense an external object by simultaneously displaying an image using a light emitter, and by passing input light from the external object through a transparent window and thereby, may take a photograph.

2. Description of the Related Art

An OLED is a light-emitting diode (LED) in which the emissive electroluminescent layer is a film of organic compounds which emit light in response to an electric current. This layer of organic semiconductor material is situated between two electrodes.

OLEDs are used in television screens, computer monitors, small, portable system screens such as mobile phones and PDAs. OLEDs are also used in large-area light-emitting elements for general illumination.

Unlike an existing liquid crystal display (LCD) apparatus, an OLED display apparatus is self luminous and thus works without a backlight. Therefore, it can display deep black levels and can be thinner and lighter than an LCD. Accordingly, OLEDs have recently been the subject of much interest.

SUMMARY

The foregoing and/or other aspects are achieved by providing an organic light emitting diode (OLED) display apparatus having a light sensing function, comprising: a display panel comprising an imaging pattern formed with a plurality of OLED pixels; and a sensor panel to sense input light from an external object, the light passing through the imaging pattern.

The display panel may form the imaging pattern by arranging each of the plurality of OLED pixels based on transparency level of a window included in a corresponding OLED pixel.

The display panel may form the imaging pattern to be in one of a circular hole, a polygonal hole, and a modified uniformly redundant array (MURA) by combining a first OLED pixel comprising an opaque window with a second OLED pixel comprising a transparent window.

The OLED display apparatus may further include an infrared ray light source to emit an infrared ray towards the external object; and a pass filter to extract an infrared component from the input light comprising the infrared ray returned from the external object. The sensor panel may sense the infrared component.

The foregoing and/or other aspects are achieved by providing an organic light emitting diode (OLED) display apparatus having a light sensing function. The apparatus includes a display panel comprising an imaging pattern formed with a plurality of OLED pixels, and a sensor panel disposed behind the display panel and comprising at least one sensor to sense light that has passed through the imaging pattern.

Additional aspects of embodiments will be set forth in part in the description which follows and, in part, will be apparent from the description, or may be learned by practice of the disclosure.

BRIEF DESCRIPTION OF THE DRAWINGS

These and/or other aspects will become apparent and more readily appreciated from the following description of embodiments, taken in conjunction with the accompanying drawings of which.

DETAILED DESCRIPTION

Figure 1:
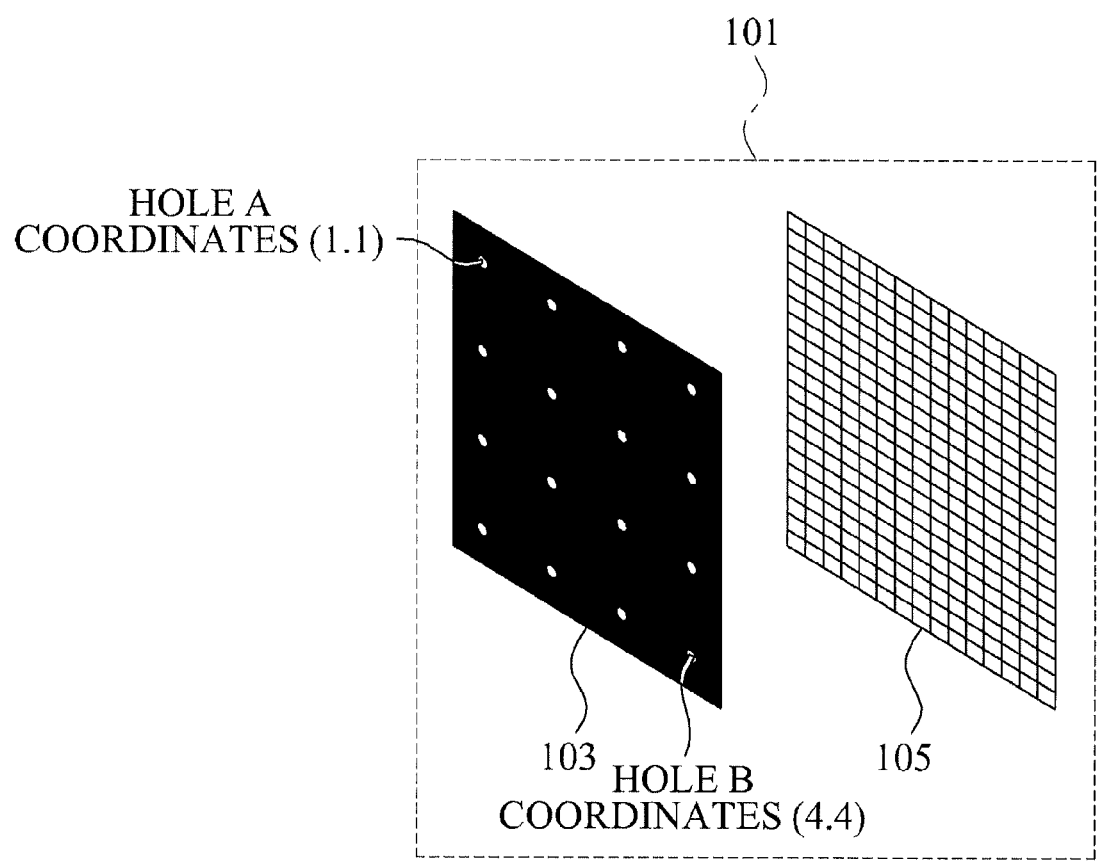
FIG. 1 illustrates a configuration of an organic light emitting diode (OLED) display apparatus having a light sensing function according to example embodiments.

Reference will now be made in detail to embodiments, examples of which are illustrated in the accompanying drawings, wherein like reference numerals refer to the like elements throughout. Embodiments are described below to explain the present disclosure by referring to the figures.

The term "organic light emitting diode (OLED)" used throughout the present specification denotes a self-luminous element that is different from a general liquid crystal display (LCD) emitting light by a backlight. In general, compared to the LCD, the OLED may have relatively excellent color definition, and optical viewing angle, a quick response speed, low power, slimness, and the like. Following the LCD, a plasma display panel (PDP), and the like, the OLED has been receiving attention as a next generation display. In particular, proposed herein is a display apparatus that may simultaneously realize displaying of an image and recognizing a space touch of a user, for example recognizing a movement within a 3-dimensional (3D) space, by providing a pixel further including a window to pass input light from an external object while displaying the image using the OLED.

FIG. 1 illustrates a configuration of an OLED display apparatus 101 having a light sensing function according to example embodiments.

Referring to FIG. 1, the OLED display apparatus 101 having the light sensing function may include, for example, a display panel 103 and a sensor panel 105.

The display panel 103 may include an imaging pattern formed with a plurality of OLED pixels. For example, the display panel 103 may provide an environment for photographing an external object by including the imaging pattern formed with the plurality of OLED pixels, and by passing input light from the external object through the imaging pattern. Referring to FIG. 1, the display panel 103 may be located directly above or on top of the sensor panel 105 such as in a stacked configuration.

The display panel 103 may display a general image using an OLED, and may also pass the light input from the external object through the imaging pattern without having to separately switching a mode based on a time division that is formed and combined based on a transparency adjustment of a window included in each of the OLED pixels.

When forming the imaging pattern, the display panel 103 may form various shapes of imaging patterns by combining a first OLED pixel including an opaque window with a second OLED pixel including a transparent window.

For example, the display panel 103 may form a pattern for passing the input light, for example the imaging pattern with a circular hole, by adjusting the opaque window within the first OLED pixel to be opaque, and by adjusting the transparent window within the second OLED pixel to be transparent.

Similarly, the display panel 103 may form the imaging pattern in a variety of shapes, for example, the circular hole, a polygonal hole, a modified uniformly redundant array (MURA), and the like, by appropriately adjusting and combining a transparency level of the window included in each of the first OLED pixel and the second OLED pixel.

The display panel 103 may form various shapes of imaging patterns by changing a quantity of OLED pixels or positions of the OLED pixels and by arranging the plurality of OLED pixels based on a transparency of a window included in each OLED pixel. For example, the display panel 103 may form a plurality of imaging patterns based on an external environment where light enters, and may change a number of imaging patterns or positions of imaging patterns based on a predetermined period. For example, the display panel 103 may repeatedly form the plurality of imaging patterns with respect to a horizontal direction or a vertical direction.

A function of the display panel 103 to display an image will be described with reference to FIG. 2.

Figure 2:
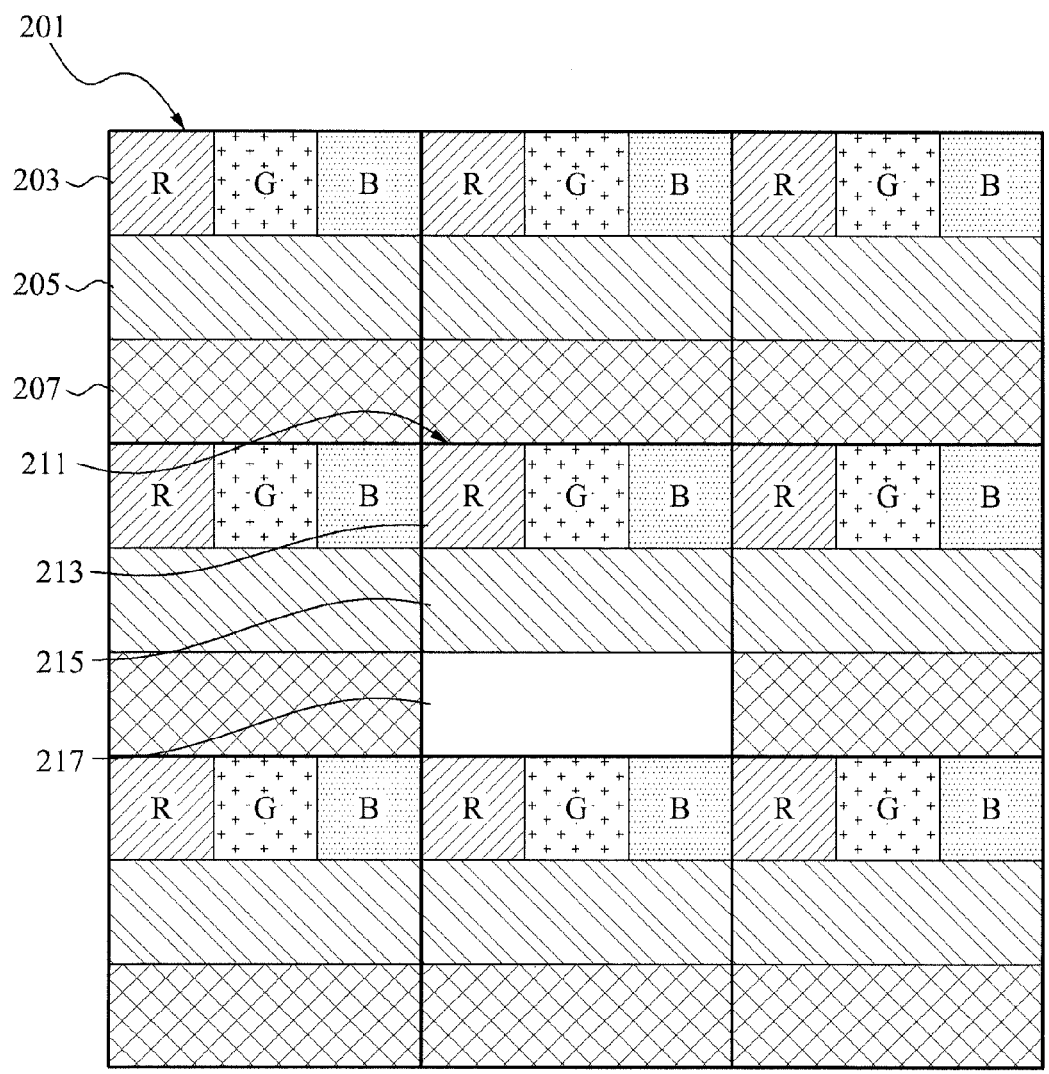
FIG. 2 illustrates OLED pixels according to example embodiments.

FIG. 2 illustrates OLED pixels according to example embodiments.

Without using a separate backlight, the display panel 103 may include a plurality of OLED pixels and display an image through self-luminescence. In this example, displaying of the image on the display panel 103 may be simultaneously performed with the passing of input light using an imaging pattern and photographing, that is, with the sensing of an external object.

Referring to FIG. 2, each of the OLED pixels may include, for example, a light emitter to emit one of a red light, a green light, and a blue light using a luminous organic material, a circuit unit to drive the light emitter, and a window, for example, a glass substrate to pass or block the input light. When the window is formed to be transparent, the window may pass the light input from the outside, such as light reflected by an external object. When the window is formed to be opaque, the window may block the input light from the outside.

For example, a first OLED pixel 201 may include a light emitter 203 to emit light and to display an image such as a broadcast image, a circuit unit 205 to drive the light emitter 203, and an opaque window 207 to block the input light from the outside. A second OLED pixel 211 may be configured to be similar to the first OLED pixel 201, or may be configured to include a light emitter 213, a circuit unit 215, and a transparent window 217 to pass the input light from the outside as is.

Referring again to FIG. 1, the sensor panel 105 may photograph the external object by sensing the input light from the external object passing through the imaging pattern included in the display panel 103, and by obtaining image data associated with the external object. In this example, it is possible to stabilize the quality of image data obtained at the sensor panel 103 by maintaining the whole transparency level of the imaging patterns included in the display panel 103 to be a predetermined level.

The sensor panel 105 may be disposed at a rear end of the display panel 103 or below the display panel 103 to sense the light that is input from the external object and that passes through the display apparatus 103 at a predetermined transparency level, and to obtain image data associated with the external object.

For example, the sensor panel 105 may sense the input light passing through the window by configuring a sensor unit and an aperture to be in a form of a grid pattern or in a form of a repeating pattern. The sensor unit may sense the input light and the aperture may pass the input light. The sensor panel 105 may further include a color filter to obtain image data corresponding to a color of the color filter.

According to an embodiment, an OLED display apparatus having a light sensing function may display an image and photograph an external object, for example at the same time or substantially the same time, by simultaneously processing displaying of the image using a light emitter and sensing of input light from an external object passing through an imaging pattern included in a display panel.

In addition, the OLED display apparatus having the light sensing function may be used in a variety of fields such as proximity sensing, gesture recognition, photography, by simultaneously providing an image display function and an external object photographing function.

For example, when displaying a three-dimensional (3D) image, the OLED display apparatus having the light sensing function may photograph the external object and obtain a distance between the OLED display apparatus and the external object, or position information of the OLED display apparatus and the external object. Accordingly, the OLED display apparatus may readily recognize a gesture and readily sense a manipulation on a 3D image appearing to be positioned outside the OLED display apparatus, for example, outside a screen.

When the OLED display apparatus having the light sensing function is applied to a terminal supporting a video call, an image displaying position and an external object photographing position may match and thus, a user may make a video call while viewing a face of a counter party, that is, the party being called.

When the OLED display apparatus having the light sensing function is applied to a relatively large screen, for example, a smart window, a user may recognize a minute motion of a counter party by obtaining a distance of the counter party from the screen or position information using an image of the counter party. Accordingly, the user may perceive the user as if the user were present in the same space as the counter party.

Referring again to FIG. 1, the OLED display apparatus 101 may recognize a movement of the external object within a predetermined space based on a change in a position where the input light is sensed. For example, when a user touches a space, the OLED display apparatus may verify a movement of the user within the space, for example, a drag and the like. For the above operation, virtual coordinates may be set at each imaging pattern or hole included in the display panel 103. The sensor panel 105 may identify coordinates of a hole passed by each of input lights sensed at predetermined time intervals with respect to the same external object, and may verify the movement of the external object within the space.

For example, with respect to 16 holes within the imaging pattern of FIG. 1, the display panel 103 may sequentially set coordinates of the holes from hole A with coordinates (1, 1) to hole B with coordinates (4, 4). When a plurality of input lights with respect to the external object sequentially passes through the hole A and the hole B at predetermined time intervals, the sensor panel 105 may sense that the external object has moved from coordinates (1, 1) to coordinates (4, 4).

The OLED display apparatus 101 may verify a space touch of the external object by combining sensing results with respect to one or more holes within the imaging pattern.

For example, when 16 holes are arranged within the imaging pattern as shown in FIG. 1, a sensing result at the sensor panel 105 associated with each of 16 holes with respect to the external object may be different based on a position relationship between a corresponding hole and the external object, an incident angle of related input light, and the like. Accordingly, the sensor panel 105 may accurately recognize a position of the external object within the space, that is, a form of the space touch by combining sensing results of 16 holes.

The sensor panel 105 may sense the position of the external object within the space based on an aspect that a sensing result of input light with respect to the external object is slightly different based on an arrangement position of each hole.

A model of calculating a position of an external object within a space using a plurality of different sensing results is disclosed in "BiDi Screen: Depth and Lighting Aware Interaction and Display," by Matthew Hirsch, Douglas Lanman, Ramesh Raskar, and Henry Holtzman, in Proceedings of SIGGRAPH ASIA December 2009, which is herein incorporated by reference in its entirety. Detailed descriptions related thereto will be omitted here.

The OLED display apparatus 101 may more accurately verify a movement of a drag, such as a drag of an object across the display, and the like within the space after the space touch by combining sensing results of holes within the imaging pattern with respect to the external object at predetermined time intervals, and by using the combined sensing results.

For example, when 16 holes are arranged in the imaging pattern as shown in FIG. 1, the OLED display apparatus 101 may induce a movement start position of the external object within the space based on a combination of sensing results at the sensor panel 105 associated with the 16 holes at a point in time T1. Similarly, at a point in time T2, the OLED display apparatus 101 may induce a movement end position within the space based on the combination of sensing results at the sensor panel 105 associated with the 16 holes.

That is, the OLED display apparatus 101 may verify a position of the external object within the space, for example, coordinates (1, 1) at the point in time T1 and a position of the external object within the space, for example, coordinates (4, 4) at the point in time T2 that is a point in time after a predetermined amount of time is elapsed from the point in time T1, and may sense that the external object has moved from coordinates (1, 1) to coordinates (4, 4).

Accordingly, the OLED display apparatus 101 may accurately verify a movement of the external object within the space based on a change in the movement start position of the object and the movement end position of the object within the space.

Figure 3:
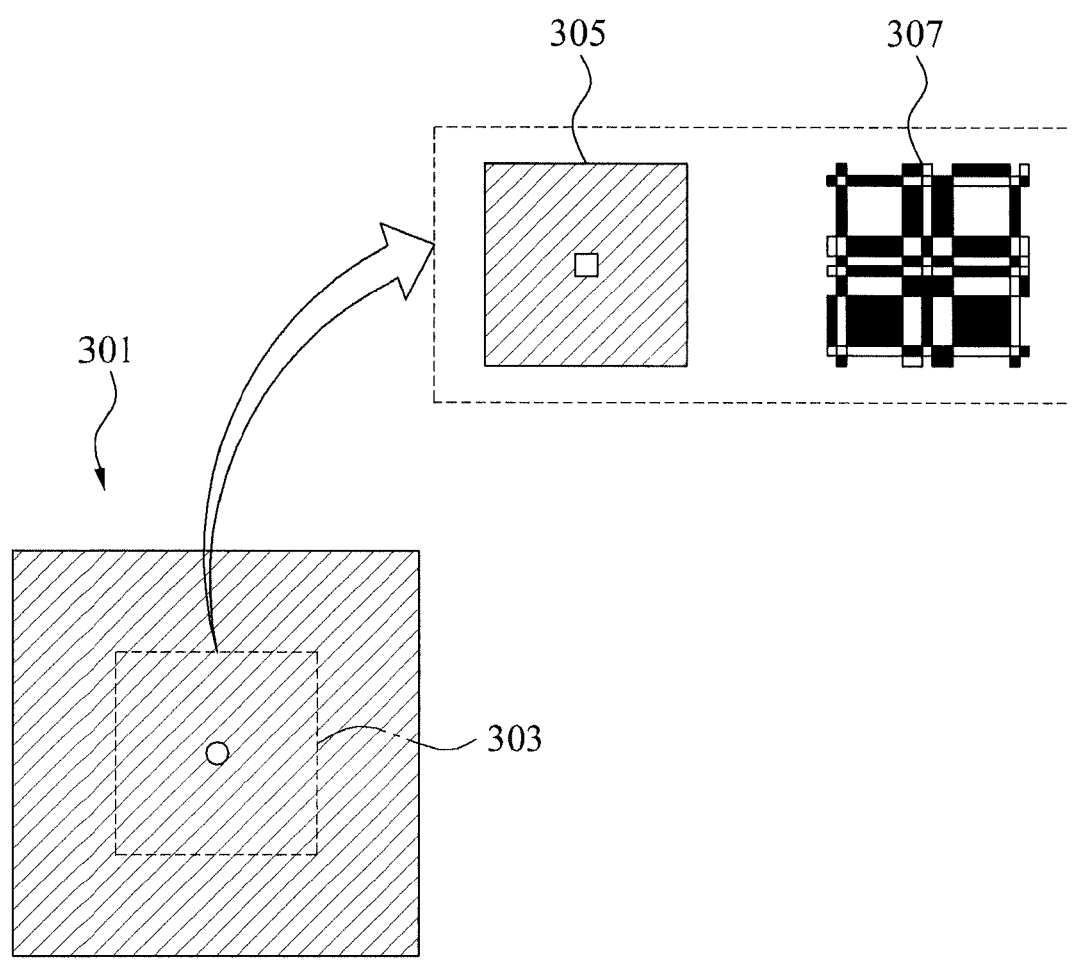
FIG. 3 illustrates an imaging pattern of a display panel included in an OLED display apparatus having a light sensing function according to example embodiments.

FIG. 3 illustrates an imaging pattern of a display panel 301 included in an OLED display apparatus having a light sensing function according to example embodiments.

As described above, the display panel 301 may form the imaging pattern to be in one of a circular hole, a polygonal hole, and a MURA hole, by arranging and combining a plurality of OLED pixels based on a transparency level of a window included in each OLED pixel.

Referring to FIG. 3, the display panel 301 may include the imaging pattern formed with the plurality of OLED pixels, and may pass input light from an external object through the imaging pattern.

The display panel 301 may form, as the imaging pattern for passing the light, a pattern 303 including a circular hole. However, it is only an example and thus, a pattern 305 including a polygonal hole or a pattern 307 including a MURA may be formed.

Figure 4:
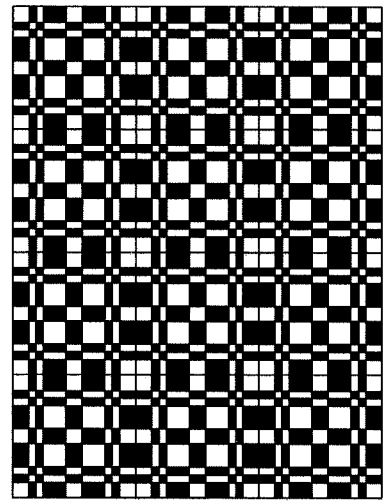
FIG. 4 illustrates an imaging pattern of a display panel included in an OLED display apparatus having a light sensing function according to other example embodiments.
Figure 4:
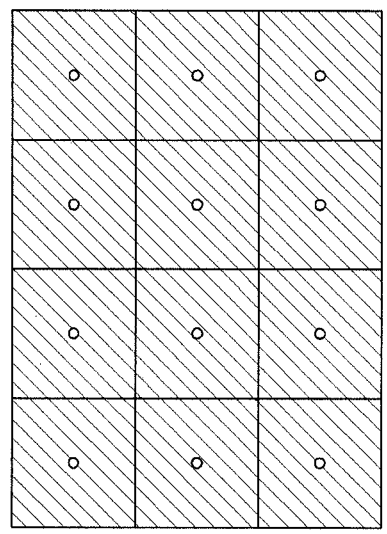
Figure 4:
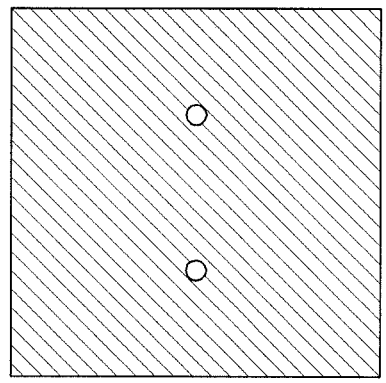

FIG. 4 illustrates an imaging pattern of a display panel included in an OLED display apparatus having a light sensing function according to other example embodiments.

Accordingly, the OLED display apparatus may pass a plurality of input lights from the external object using the display panel formed with a plurality of imaging patterns, and may sense the plurality of input lights using a sensor panel. Thus, it is possible to obtain the effect of photographing the external object using a plurality of cameras.

Figure 5:
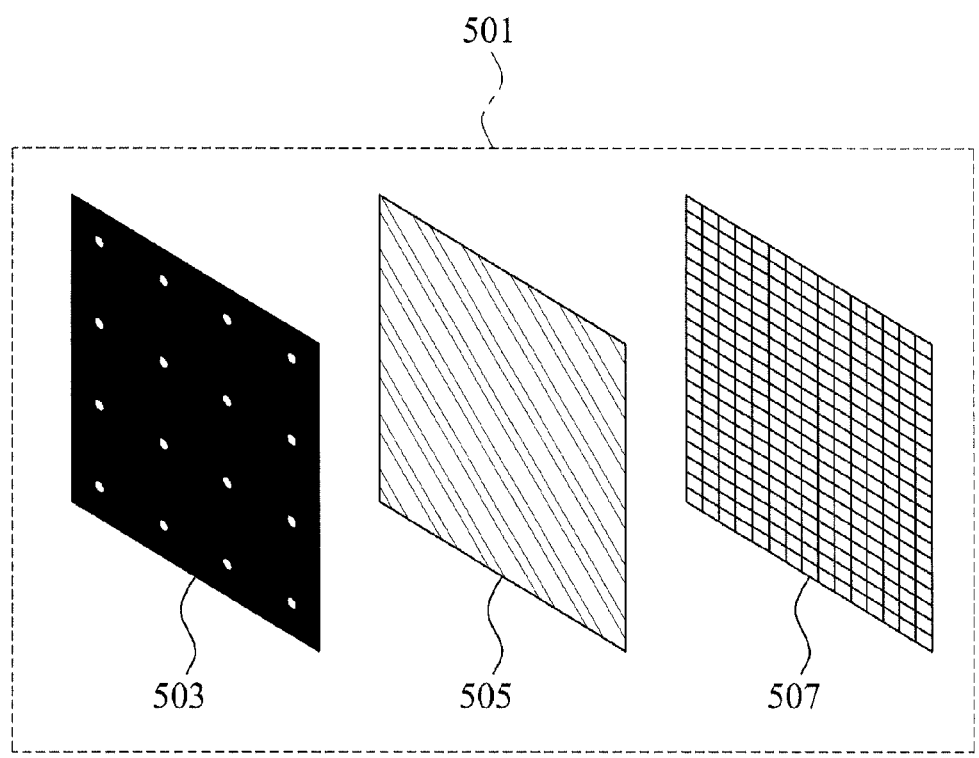
FIG. 5 illustrates a configuration of an OLED display apparatus having a light sensing function according to other example embodiments.

FIG. 5 illustrates a configuration of an OLED display apparatus 501 having a light sensing function according to other example embodiments.

Referring to FIG. 5, the OLED display apparatus 501 may further include a pass filter 505 in addition to a display panel 503 and a sensor panel 507.

As described above, the display panel 503 may include an imaging pattern formed with a plurality of OLED pixels, and may pass input light, for example, sunlight from an external object through the imaging pattern.

The input light may include an infrared ray (IR) reflected from the external object. For the above operation, the OLED display apparatus 501 may further include an IR light source being disposed in one portion of the display panel 503 to emit the IR towards the external object. Accordingly, the OLED display apparatus 501 may sense a relatively large amount of infrared components from the input light and thus, may obtain cleaner image data with respect to the external object.

The IR emitted from the IR light source may be returned from the external object and be input into the display panel 503 as the input light. The display panel 503 may transfer the input light to the pass filter 505 disposed at a rear end such as a rear face or back surface of the display panel 503, through the imaging pattern.

The pass filter 505 (hereinafter, a first pass filter) may be disposed between the display panel 503 and the sensor panel 507, for example in a sandwich-like configuration, to extract an infrared component from the input light passing through the imaging pattern of the display panel 503.

The sensor panel 507 disposed at the rear end of the first pass filter may generate image data by sensing the extracted infrared component and photographing the external object, for example, a space touch.

The IR light source may be included in an OLED pixel as an internal configuration. In this example, an infrared component may be extracted from the input light including an IR returned from the external object by the pass filter 505 (hereinafter, a second pass filter) included in the OLED pixel as the internal configuration.

The pass filter 505 functioning as the second pass filter may extract the infrared component from the input light from the external object, and transfer the extracted infrared component to the imaging pattern of the display panel 503.

The sensor panel 507 positioned at the rear end of the display panel 503 may sense the infrared component passing through the imaging pattern of the display panel 503. A ray, for example, a visible ray excluding the infrared ray included in the input light may be blocked by the pass filter 505 and thus, the sensor panel 507 may obtain image data with respect to the external object using only the sensed infrared component. Accordingly, it is possible to decrease noise in the image.

Figure 6:
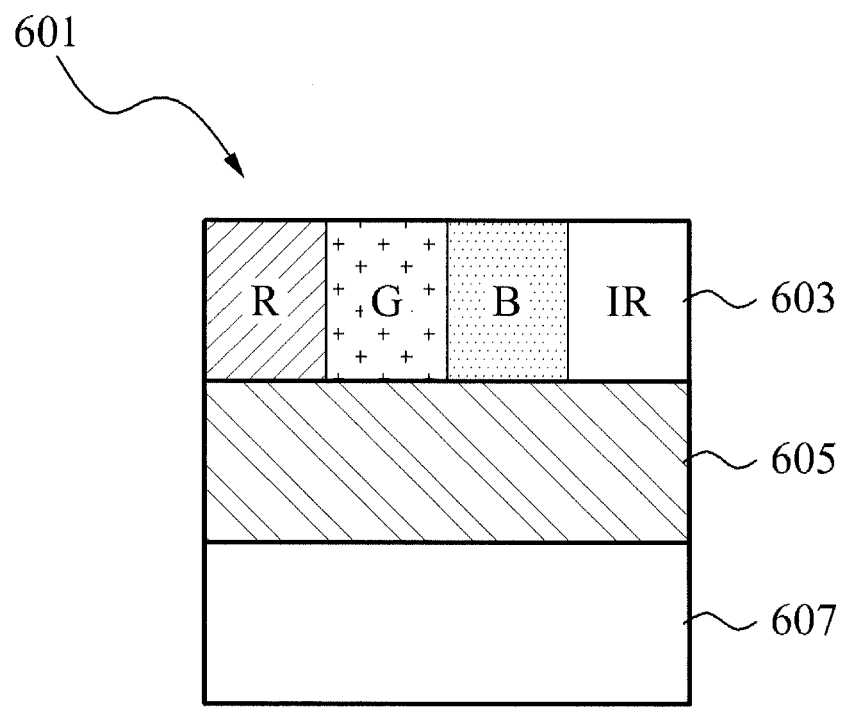
FIG. 6 illustrates an OLED pixel including an infrared ray (IR) light source according to example embodiments.

FIG. 6 illustrates an OLED pixel 601 including an IR light source according to example embodiments.

Referring to FIG. 6, the OLED pixel 601 may include a light emitter 603, a circuit unit 605 to drive the light emitter 603, and a window 607, for example, a glass substrate, to alternatively pass or block light from an outside. The light emitter 603 may include red light R, green light G, blue light B, and an IR light source IR to emit an IR towards an external object.

Accordingly, the OLED pixel 601 may display an image by one of or a combination of the red light R, the green light G, and the blue light B. Also, the OLED pixel 601 may pass the input light including the IR through an imaging pattern configured as a transparency adjustable window, thereby enabling a pass filter and a sensor panel to sense the external object using an infrared component.

The IR light source IR may be included in the OLED pixel 601. However, it is only an example and thus, may also be included in a case, for example, a bezel of the OLED display apparatus 601.

Figure 7:
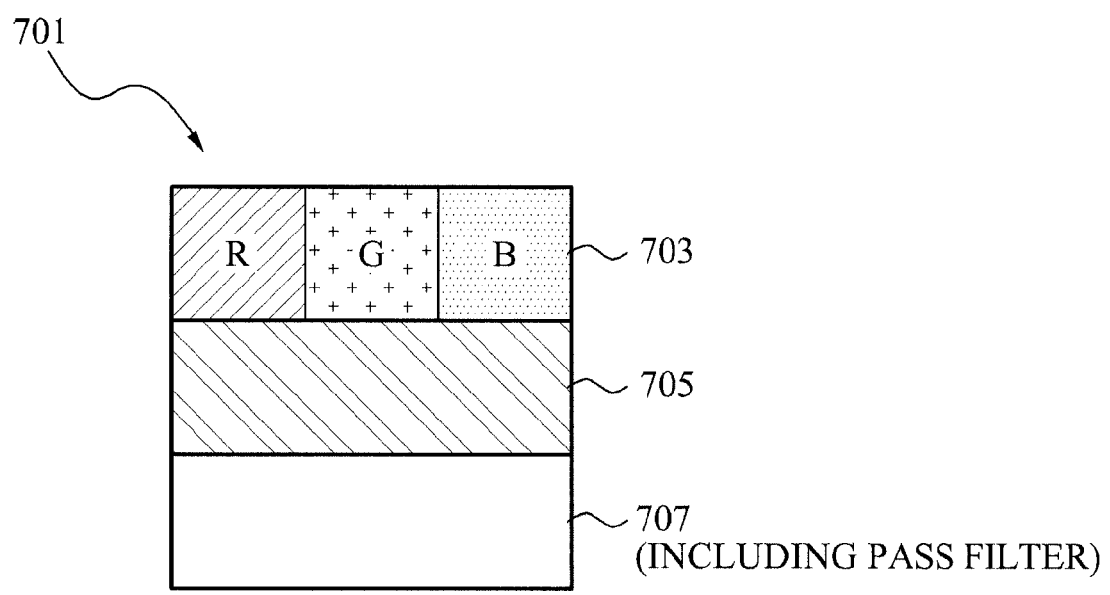
FIG. 7 illustrates an OLED pixel including a pass filter according to example embodiments.

FIG. 7 illustrates an OLED pixel 701 including a pass filter according to example embodiments.

Referring to FIG. 7, the OLED pixel 701 may include a light emitter 703 to emit one of red light R, green light G, and blue light B using a luminous organic material, a circuit unit 705 to drive the light emitter 703, and a window 707, for example, a glass substrate to alternatively pass or block input light from an outside. The OLED pixel 701 may further include, in an upper portion or a lower portion of the window 707, a second pass filter to extract an infrared component.

According to an embodiment, an OLED display apparatus having a light sensing function may photograph an external object using IR by sensing an infrared component from the external object passing through an imaging pattern included in a display panel, using an IR light source to emit the IR towards the external object and a pass filter to extract the infrared component.

According to an embodiment, an OLED display apparatus having a light sensing apparatus may display an image by transferring input light from an external object to a sensor panel through adjustment of a transparency with respect to a window included in an OLED pixel. Also, the OLED display apparatus may photograph the external object without switching an apparatus mode. That is, the OLED display apparatus may also sense a space touch.

According to an embodiment, an OLED display apparatus having a light sensing function may photograph an external object in conjunction with the displaying of an image by simultaneously processing displaying of the image using a light emitter and sensing of input light from the external object passing through an imaging pattern included in a display panel.

According to an embodiment, an OLED display apparatus having a light sensing function may accurately sense an external object without noise by employing an IR light source to emit IR towards the external object and a pass filter to extract, from the input light, an infrared component associated with the IR.

Although embodiments have been shown and described, it would be appreciated by those skilled in the art that changes may be made in these embodiments without departing from the principles and spirit of the disclosure, the scope of which is defined by the claims and their equivalents.

What is claimed is:

1. An organic light emitting diode (OLED) display apparatus having a light sensing function, the apparatus comprising:
   a display panel comprising an imaging pattern formed with a plurality of OLED pixels, wherein the display panel forms the imaging pattern by arranging each of the plurality of OLED pixels based on transparency level of a window included in a corresponding OLED pixel; and
   a sensor panel comprising at least one sensor configured to sense input light from an external object, the light passing through the imaging pattern,
   wherein each of the plurality of OLED pixels sequentially includes light emitters configured to emit light, a circuit portion, and the window comprising a glass substrate and determining the transparency level for passing the light from the external object to the sensor panel,
   wherein the display panel enables the sensor panel to sense the input light from the external object by simultaneously displaying an image using the light emitters of each of the OLED pixels and passing the input light using the window of each of the OLED pixels, and
   wherein the display panel forms the imaging pattern to be a modified uniformly redundant array (MURA) pattern including repeated different arrangements of adjacent transparent windows, by combining a first OLED pixel comprising an opaque window with a second OLED pixel comprising a transparent window.

2. The OLED display apparatus of claim 1, wherein the light emitters emit at least one of a red light, a green light, and a blue light.

3. The OLED display apparatus of claim 1, further comprising:
   an infrared ray light source to emit an infrared ray towards the external object; and
   a pass filter to extract an infrared component from the input light comprising the infrared ray returned from the external object,
   wherein the sensor panel senses the infrared component.

4. The OLED display apparatus of claim 1, further comprising:
   an infrared ray light source included in each of the OLED pixels to emit an infrared ray towards the external object; and
   a pass filter included in each of the OLED pixels to extract an infrared component from the input light comprising the infrared ray returned from the external object, and to transfer the extracted infrared component to the sensor panel,
   wherein the sensor panel senses the infrared component passing through the imaging pattern.

5. The OLED display apparatus of claim 1, further comprising:
an infrared ray light source included in each of the OLED pixels to emit an infrared ray towards the external object; and
a pass filter to extract an infrared component from the input light comprising the infrared ray returned from the external object,
wherein the sensor panel senses the infrared component.

6. The OLED display apparatus of claim 1, wherein the imaging pattern is formed by adjusting the transparency of the window included in each of the plurality of OLED pixels to be either transparent or opaque.

7. The OLED display apparatus of claim 1, wherein each of the plurality of OLED pixels includes a single window.

8. An organic light emitting diode (OLED) display apparatus having a light sensing function, the apparatus comprising:
a display panel comprising an imaging pattern formed with a plurality of OLED pixels, wherein the display panel forms the imaging pattern by arranging each of the plurality of OLED pixels based on transparency level of a window included in a corresponding OLED pixel; and
a sensor panel disposed behind the display panel and comprising at least one sensor configured to sense input light that has passed through the imaging pattern,
wherein each of the plurality of OLED pixels sequentially includes light emitters configured to emit light, a circuit portion, and the window comprising a glass substrate and determining the transparency level for passing the input light to the sensor panel,
wherein the display panel enables the sensor panel to sense the input light by simultaneously displaying an image using the light emitters of each of the OLED pixels and passing the input light using the window of each of the OLED pixels, and
wherein the display panel forms the imaging pattern to be a modified uniformly redundant array (MURA) pattern including repeated different arrangements of adjacent transparent windows, by combining a first OLED pixel comprising an opaque window with a second OLED pixel comprising a transparent window.

9. The OLED display apparatus of claim 8, wherein the imaging pattern is formed by adjusting the transparency of the window included in each of the plurality of OLED pixels to be either transparent or opaque.

10. The OLED display apparatus of claim 8, further comprising:
an infrared ray light source to emit an infrared ray towards an external object; and
a pass filter to extract an infrared component from the input light comprising the infrared ray returned from the external object, wherein the sensor panel senses the extracted infrared component.

11. The OLED display apparatus of claim 10, wherein the pass filter is disposed between the display panel and the sensor panel.

12. An organic light emitting diode (OLED) display apparatus having a light sensing function, the apparatus comprising:
a display panel comprising an imaging pattern formed with a plurality of OLED pixels, wherein the display panel forms the imaging pattern by arranging each of the plurality of OLED pixels based on transparency level of a window portion included in a corresponding OLED pixel; and
a sensor panel comprising at least one sensor configured to sense input light from an external object, the light passing through the imaging pattern,
wherein each of the plurality of OLED pixels of the display panel sequentially comprises:
a light emitter portion comprising a red light emitter, a green light emitter; and a blue light emitter arranged sequentially;
a circuit portion configured to drive the light emitter portion; and
the window portion comprising a glass substrate and determining the transparency level to selectively pass or block the light from the external object to the sensor panel,
wherein the display panel enables the sensor panel to sense the input light from the external object by simultaneously displaying an image using the light emitter portion of each of the OLED pixels and passing the input light using the window portion of each of the OLED pixels, and
wherein the display panel forms the imaging pattern to be a modified uniformly redundant array (MURA) pattern including repeated different arrangements of adjacent transparent windows, by combining a first OLED pixel comprising an opaque window with a second OLED pixel comprising a transparent window.

13. The OLED display apparatus of claim 12, wherein in each of the plurality of OLED pixels the light emitter portion, the circuit portion and the window portion occupies a substantially similar portion of the OLED pixel.

* * * * *